(12) United States Patent
Xue et al.

(10) Patent No.: US 9,479,114 B1
(45) Date of Patent: Oct. 25, 2016

(54) QUADRATURE VOLTAGE CONTROLLED OSCILLATOR

(71) Applicant: City University of Hong Kong, Kowloon (HK)

(72) Inventors: Quan Xue, Kowloon (HK); Haiwai Zhang, Kowloon (HK); Kam Man Shum, Kowloon (HK)

(73) Assignee: City University of Hong Kong, Hong Kong (HK)

( * ) Notice: Subject to any disclaimer, the term of this patent is extended or adjusted under 35 U.S.C. 154(b) by 0 days.

(21) Appl. No.: 14/803,423

(22) Filed: Jul. 20, 2015

(51) Int. Cl.
*H04B 1/40* (2015.01)
*H03B 5/12* (2006.01)
*H03B 27/00* (2006.01)

(52) U.S. Cl.
CPC ............ *H03B 27/00* (2013.01); *H03B 5/1212* (2013.01); *H03B 5/1228* (2013.01); *H03B 5/1265* (2013.01); *H04B 1/40* (2013.01)

(58) Field of Classification Search
CPC .......... H04B 1/28; H04B 1/40; H04B 15/04; H03B 5/1212; H03B 5/1215; H03B 5/1228; H03B 19/14; H03B 2200/0078; H03L 7/00; H03L 7/24
USPC .......... 455/77, 255, 313, 318; 331/2, 46, 56, 331/57, 108 R, 117 FE, 117 R
See application file for complete search history.

(56) References Cited

U.S. PATENT DOCUMENTS

| | | | |
|---|---|---|---|
| 6,995,619 B2* | 2/2006 | Cho ........................ | H03B 27/00 331/117 FE |
| 7,026,880 B2* | 4/2006 | Shi ......................... | H03B 27/00 331/46 |
| 7,145,409 B2* | 12/2006 | Lee ........................ | H03K 3/354 331/117 FE |
| 8,456,246 B2* | 6/2013 | Lee ....................... | H03B 5/1228 331/117 FE |
| 8,779,861 B2* | 7/2014 | Wang .................... | H03K 3/0315 331/117 FE |
| 9,257,939 B1* | 2/2016 | Zhang ................... | H03B 5/1212 |

(Continued)

OTHER PUBLICATIONS

P. Liu, S. P. Sah, X. Yu, J. Jung, P. Upadhyaya, T. N. Nguyen, and D. Heo, "Design Techniques for Load-Independent Direct Bulk-Coupled Low Power QVCO", IEEE Transactions on Microwave Theory and Techniques, vol. 61, No. 10, pp. 3658-3665, Oct. 2013.

(Continued)

*Primary Examiner* — Quochien B Vuong
(74) *Attorney, Agent, or Firm* — Renner Kenner Greive Bobak Taylor & Weber

(57) ABSTRACT

A quadrature voltage controlled oscillator includes a first voltage controlled oscillator having a first current source, a first oscillator circuit, a first tuning circuit, and a first resonator tank; a second voltage controlled oscillator having a second current source, a second oscillator circuit, a second tuning circuit, and a second resonator tank. A first biasing circuit is connected between first and second transistors of the first oscillator circuit to bias them in Class-C mode; and a second biasing circuit is connected between third and fourth transistors of the second oscillator circuit to bias them in Class-C mode. The first and second voltage controlled oscillators are electrically coupled by bulk terminals of the first and second transistors coupled with drain terminals of the third and fourth transistors respectively, and bulk terminals of the third and fourth transistors coupled with drain terminals of the first and second transistors respectively.

24 Claims, 5 Drawing Sheets

(56) References Cited

U.S. PATENT DOCUMENTS

2007/0247242 A1* 10/2007 Kim ................. H03B 27/00
                                                   331/1 A
2012/0249250 A1* 10/2012 Cheng ............... H03B 27/00
                                                   331/45

OTHER PUBLICATIONS

H. R. Kim, C. Y. Cha, S. M. Oh, M. S. Yang, and S. G. Lee, "A Very Low-Power Quadrature VCO with Back-Gate Coupling", IEEE Journal of Solid-State Circuits, vol. 39, No. 6, pp. 952-955, Jun. 2004.

A. Mazzanti and P. Andreani, "A Push-Pull Class-C CMOS VCO", IEEE Journal of Solid-State Circuits, vol. 48, No. 3, pp. 724-732, Mar. 2013.

L. Fanori and P. Andreani, "Highly-Efficient Class-C CMOS VCOs, Including a Comparison with Class-B VCOs", IEEE Journal of Solid-State Circuits, vol. 48, No. 7, pp. 1730-1740, Jul. 2013.

A. Mazzanti and P. Andreani, "Class-C Harmonic Cmos VCOs, with a General Result on Phase Noise", IEEE Journal of Solid-State Circuits, vol. 43, No. 12, pp. 2716-2729, Dec. 2008.

Y. X. Zhang and C. C. Boon, "An In-Phase Coupled Class-C Quadrature VCO with Tunable Phase Error", IEEE Microwave and Wireless Components Letters, vol. 24, No. 11, pp. 796-798, Nov. 2014.

S. Jain and S. L. Jang, "Indirect Back-Gate Coupling Quadrature LC-VCO", IEEE Microwave and Wireless Components Letters, vol. 24, No. 2, pp. 117-119, Feb. 2014.

B. Razavi, RF Microelectronics, Ch. 8, Upper Saddle River, NJ, 2011.

Y. C. Lo and J. Silva-Martinez, "A 5-GHz CMOS LC Quadrature VCO with Dynamic Current-Clipping Coupling to Improve Phase Noise and Phase Accuracy", IEEE Transactions on Microwave Theory and Techniques, vol. 61, No. 7, pp. 2632-2640, Jul. 2013.

* cited by examiner

QUADRATURE VOLTAGE CONTROLLED OSCILLATOR

TECHNICAL FIELD

The present invention relates to a quadrature voltage controlled oscillator and particularly, although not exclusively, to a CMOS wideband low phase noise Class-C quadrature voltage controlled oscillator.

BACKGROUND OF THE INVENTION

Quadrature voltage controlled oscillator plays an important role in modern wireless communication systems, and it is particularly useful in applications that require high fidelity quadrature signals, such as in wireless and wired transceivers. One of the most popular type of quadrature voltage controlled oscillator is LC quadrature voltage controlled oscillator, and it comprises two symmetric LC tanks voltage controlled oscillators coupled with each other. Typically, LC quadrature voltage controlled oscillator can be classified into parallel-coupled quadrature voltage controlled oscillator (P-QVCO) and series-coupled quadrature voltage controlled oscillator (S-QVCO). For P-QVCO, the For P-QVCO, the coupling transistors are arranged in parallel with the switching pairs, whereas for S-QVCO, the transistors are stacked for series coupling.

In general, P-QVCO and S-QVCO can provide good phase noise performance and have relative low power consumption. However, they suffer from various problems. For example, the coupling transistors in both P-QVCO and S-QVCO may introduce additional noise, and as a result the phase noise of the quadrature voltage controlled oscillator may be degraded. Also, the oscillation efficiency in conventional P-QVCO and S-QVCO is generally low.

Accordingly, there exists a need to provide a quadrature voltage controlled oscillator that is more efficient in operation, compact in design, and more importantly, less prone to the above problems.

SUMMARY OF THE INVENTION

In accordance with a first aspect of the present invention, there is provided a quadrature voltage controlled oscillator, comprising: a first voltage controlled oscillator having a first current source, a first oscillator circuit, a first tuning circuit, and a first resonator tank electrically connected with each other; a second voltage controlled oscillator having a second current source, a second oscillator circuit, a second tuning circuit, and a second resonator tank electrically connected with each other; the first oscillator circuit comprises a first transistor, a second transistor and a first biasing circuit connected between the first and second transistors for biasing the first and second transistors to operate in Class-C mode; the second oscillator circuit comprises a third transistor, a fourth transistor and a second biasing circuit connected between the third and fourth transistors for biasing the third and fourth transistors to operate in Class-C mode; wherein bulk terminals of the first and second transistors are coupled with drain terminals of the third and fourth transistors respectively, and bulk terminals of the third and fourth transistors are coupled with drain terminals of the first and second transistors respectively, such that the first voltage controlled oscillator is electrically coupled with the second voltage controlled oscillator.

In one embodiment of the first aspect, the first, second, third and fourth transistors are PMOS transistors.

In one embodiment of the first aspect, the first biasing circuit comprises a low pass RC circuit arranged to provide a bias voltage to the first and second transistors to bias the first and second transistors to operate in Class-C mode.

In one embodiment of the first aspect, the second biasing circuit comprises a low pass RC circuit arranged to provide a bias voltage to the third and fourth transistors to bias the third and fourth transistors to operate in Class-C mode.

In one embodiment of the first aspect, source terminals of the first and second transistors are connected with each other; and source terminals of the third and fourth transistors are connected with each other.

In one embodiment of the first aspect, a gate terminal of the first transistor is connected with a drain terminal of the second transistor through the first biasing circuit, and a gate terminal of the second transistor is connected with a drain terminal of the first transistor through the first biasing circuit.

In one embodiment of the first aspect, a gate terminal of the third transistor is connected with a drain terminal of the fourth transistor through the second biasing circuit, and a gate terminal of the fourth transistor is connected with a drain terminal of the third transistor through the second biasing circuit.

In one embodiment of the first aspect, the bulk terminal of the first transistor is connected with a drain terminal of the fourth transistor, the bulk terminal of the second transistor is connected with a drain terminal of the third transistor, the bulk terminal of the third transistor is connected with a drain terminal of the first transistor, and the bulk terminal of the fourth transistor is connected with a drain terminal of the second transistor.

In one embodiment of the first aspect, the first current source is connected between a node and the source terminals of the first and second transistors for supplying current to the first and second transistors.

In one embodiment of the first aspect, the quadrature voltage controlled oscillator further comprises a first capacitor connected in parallel with the first current source between the node and the source terminals of the first and second transistors.

In one embodiment of the first aspect, the second current source is connected between a node and the source terminals of the third and fourth transistors for supplying current to the third and fourth transistors.

In one embodiment of the first aspect, the quadrature voltage controlled oscillator further comprises a second capacitor connected in parallel with the second current source between the node and the source terminals of the third and fourth transistors.

In one embodiment of the first aspect, the first and second current sources are the same current source.

In one embodiment of the first aspect, the first tuning circuit comprises a capacitor array.

In one embodiment of the first aspect, the first tuning circuit is a 4-bit switchable capacitor array.

In one embodiment of the first aspect, the second tuning circuit comprises a capacitor array.

In one embodiment of the first aspect, the second tuning circuit is a 4-bit switchable capacitor array.

In one embodiment of the first aspect, the first resonator tank comprises an LC resonator circuit.

In one embodiment of the first aspect, the second resonator tank comprises an LC resonator circuit.

In one embodiment of the first aspect, the first tuning circuit and the first resonator tank are connected across the drain terminals of the first and second transistors.

In one embodiment of the first aspect, the second tuning circuit and the second resonator tank are connected across the drain terminals of the third and fourth transistors.

In one embodiment of the first aspect, the first voltage controlled oscillator is substantially identical to the second voltage controlled oscillator.

In one embodiment of the first aspect, the quadrature voltage controlled oscillator is a CMOS quadrature voltage controlled oscillator.

In accordance with a second aspect of the present invention, there is provided a radiofrequency transceiver comprising the quadrature voltage controlled oscillator in accordance with the first aspect.

It is an object of the present invention to address the above needs, to overcome or substantially ameliorate the above disadvantages or, more generally, to provide an improved quadrature voltage controlled oscillator.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Figure 1:
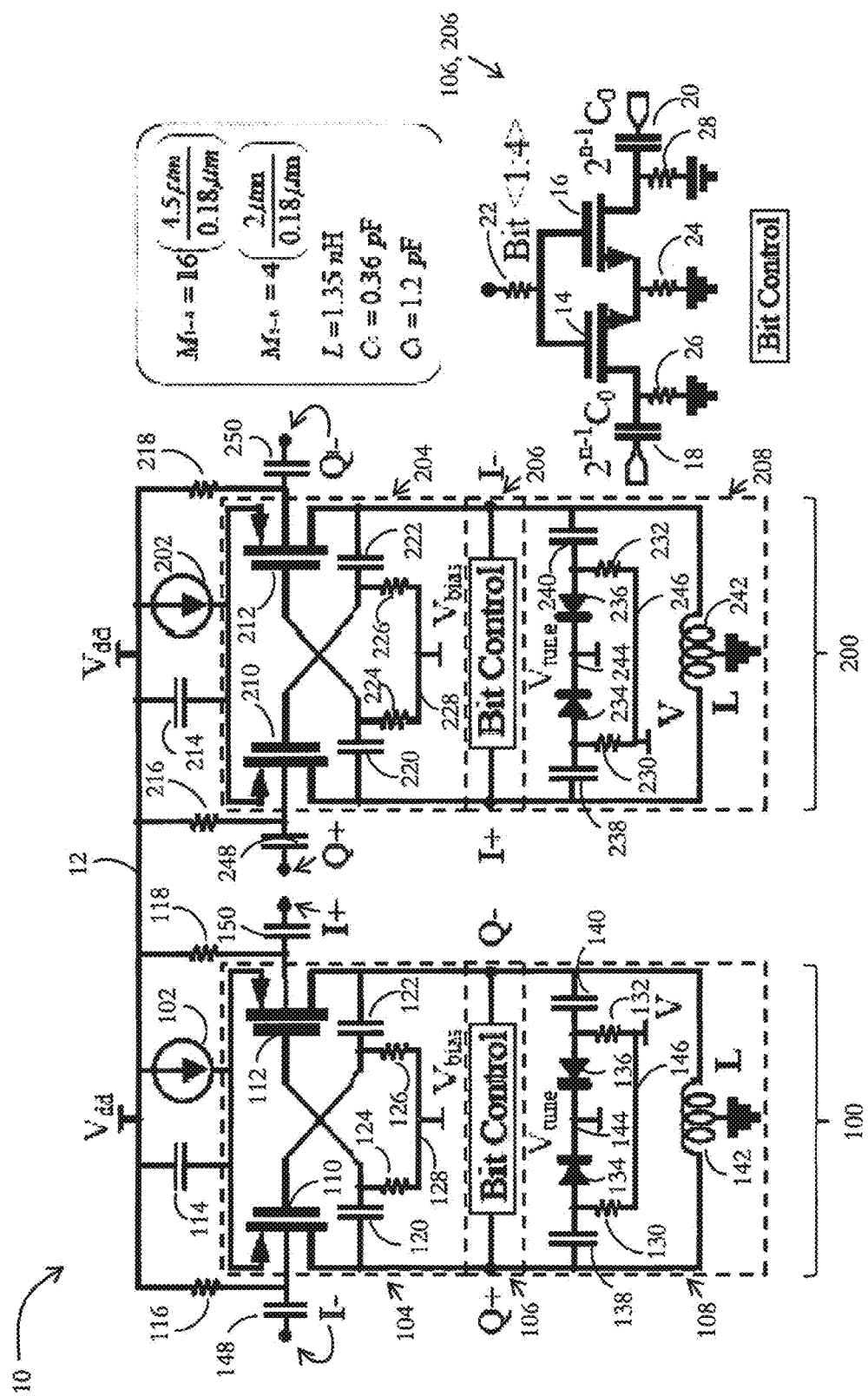
FIG. 1 is a circuit diagram showing a quadrature voltage controlled oscillator in accordance with one embodiment of the present invention.

Referring to FIG. 1, there is provided a quadrature voltage controlled oscillator 10, comprising: a first voltage controlled oscillator 100 having a first current source 102, a first oscillator circuit 104, a first tuning circuit 106, and a first resonator tank 108 electrically connected with each other; a second voltage controlled oscillator 200 having a second current source 202, a second oscillator circuit 204, a second tuning circuit 206, and a second resonator tank 208 electrically connected with each other; the first oscillator circuit 104 comprises a first transistor 110, a second transistor 112 and a first biasing circuit connected between the first and second transistors 110, 112 for biasing the first and second transistors 110, 112 to operate in Class-C mode; the second oscillator circuit 204 comprises a third transistor 210, a fourth transistor 212 and a second biasing circuit connected between the third and fourth transistors 210, 212 for biasing the third and fourth transistors 210, 212 to operate in Class-C mode; wherein bulk terminals of the first and second transistors 110 112 are coupled with drain terminals of the third and fourth transistors 210, 212 respectively, and bulk terminals of the third and fourth transistors 210, 212 are coupled with drain terminals of the first and second transistors 110, 112 respectively, such that the first voltage controlled oscillator 100 is electrically coupled with the second voltage controlled oscillator 200. Preferably, the first, second, third and fourth transistors 110, 112, 210, 212 are all p-channel MOSFET (PMOS transistors). The quadrature voltage controlled oscillator 10 in the present invention is arranged for Class-C operation to generate high and narrow current pulses, and this results in high fundamental current amplitude $I_{\omega 0}$.

In the present embodiment, the quadrature voltage controlled oscillator 10 is preferably a wideband low phase noise quadrature voltage controlled oscillator implemented in 0.18 μm complementary metal-oxide-semiconductor (CMOS). In one example, the quadrature voltage controlled oscillator 10 is constructed as a differential voltage controlled oscillator that has reduced flicker noise.

Referring to FIG. 1, the first voltage controlled oscillator 100 includes a current source 102, an oscillator circuit 104, a tuning circuit 106, and a resonator tank 108 electrically connected with each other. In the present embodiment, the current source 102 connected between a node 12 biased at voltage $V_{dd}$ and the source terminals of the first and second PMOS transistors 110, 112 for supplying current to the source terminals of the first and second PMOS transistors 110, 112. In one embodiment, a capacitor 114 is arranged in parallel with the current source 102 to ensure that the first and second PMOS transistors 110, 112 operate in an active region. Optionally, a resistor 116 is connected between the node 12 and bulk terminal of the first PMOS transistor 110 and another resistor 118 is connected between the node 12 and the bulk terminal of the second PMOS transistor 112. In the present embodiment, the source terminals of the first and second PMOS transistors 110, 112 are directly connected with each other.

The oscillator circuit 104 of the first voltage controlled oscillator 100 includes the first PMOS transistor 110, the second PMOS transistor 112, and the biasing circuit arranged to provide a respective bias voltage to the first and second PMOS transistors 110, 112 for biasing them to operate in Class-C mode. Preferably, the biasing circuit is a low pass RC circuit. As shown in FIG. 1, the RC circuit includes two capacitors 120, 122 and two resistors 124, 126 in electrical connection with each other. Preferably, the resistors 120, 122 are connected to a common node 128 biased at voltage $V_{bias}$. In one embodiment, one resistor 126 of the RC circuit is connected between the gate terminal of the first PMOS transistor 110 and the node 128, and another resistor 124 of the RC circuit is connected between the gate terminal of the second PMOS transistor 112 and the node 128. In one embodiment, one capacitor 120 of the RC circuit is connected between the drain terminal of the first PMOS transistor 110 and the gate terminal of the second PMOS transistor 112, and another capacitor 122 of the RC circuit is connected between the drain terminal of the second PMOS transistor 112 and the gate terminal of the first PMOS transistor 110. By providing a biasing circuit arrangement as described above, the first and second PMOS transistors 110, 112 can be cross-coupled with each other, i.e., with a gate terminal of one being connected with a drain terminal of the other. Preferably, the oscillator circuit 104 has a substantially symmetric circuit architecture.

In the present embodiment, the first voltage controlled oscillator 100 further includes the tuning circuit 106 connected between the first and second PMOS transistors. As shown in FIG. 1, the tuning circuit 106 is connected across the drain terminals of the first and second PMOS transistors 110, 112. Preferably, the tuning circuit 106 is a capacitor array circuit, such as a 4-bit switchable capacitor array as illustrated. Referring to FIG. 1, the 4-bit switchable capacitor array 106 includes two n-channel MOSFETs (NMOS transistors) 14, 16, two capacitors 18, 20, and a number of resistors 22, 24, 26, 28 in electrical connection with each other. Specifically, the gate terminals of the two NMOS transistors 14, 16 are connected with each other, and with a resistor 22. The source terminals of the two NMOS transistors 14, 16 are connected with each other, and with a grounded resistor 24. The drain terminals of each NMOS transistors 14, 16 are connected with a grounded resistor 26, 28 as well as a capacitor 18, 20. Preferably, the two capacitors 18, 20 are electrically connected with the drain terminals of the first and second PMOS transistors 110, 112 respectively. Preferably, the capacitor array circuit 106 has a substantially symmetric circuit architecture. The capacitor array circuit 106 in the present embodiment provides a wide tuning range.

In one embodiment, the first voltage controlled oscillator 100 further includes the resonator tank 108 in the form of a LC resonator circuit. Preferably, the LC resonator circuit 108 includes two branches arranged in parallel between the drain terminals of the first and second PMOS transistors 110, 112. Preferably, the LC resonator includes two resistors 130, 132, two diodes 134, 136, two capacitors 138, 140, and an inductor 142 in electrical connection with each other. As shown in FIG. 1, in the first branch, there are two diodes 134, 136 connected to the same node 144 biased at $V_{tune}$. The diodes 134, 136 are biased in a manner such that current can only flow into but not out of the node 144. The first branch further includes two capacitors 138, 140 each connected between a drain terminal of the respective first and second PMOS transistors 110, 112 and a respective diode 134, 136. A first sub-branch comprising two resistors 130, 132 is arranged in parallel with the two diodes 134, 136. The resistors 130, 132 in the sub-branch are connected at the same node 146 at voltage V. In the present example, the voltage V is 0.7 volt. In the present embodiment, the second branch includes an inductor 142 connected to ground, and in parallel with the first branch. Preferably, the LC resonator circuit 108 has a substantially symmetric circuit architecture.

Referring to FIG. 1, the second voltage controlled oscillator 200 also includes a current source 202, an oscillator circuit 204, a tuning circuit 206, and a resonator tank 208 electrically connected with each other. In the present embodiment, the current source 202 connected between a node 12 biased at voltage $V_{dd}$ and the source terminals of the third and fourth PMOS transistors 210, 212 for supplying current to the source terminals of the third and fourth PMOS transistors 210, 212. In one embodiment, a capacitor 214 is arranged in parallel with the current source 202 to ensure that the third and fourth PMOS transistors 210, 212 operate in an active region. Optionally, a resistor 216 is connected between the node 12 and bulk terminal of the third PMOS transistor 210 and another resistor 218 is connected between the node 12 and the bulk terminal of the fourth PMOS transistor 212. In the present embodiment, the source terminals of the third and fourth PMOS transistors 210, 212 are directly connected with each other.

The oscillator circuit 204 of the second voltage controlled oscillator 200 includes the third PMOS transistor 210, the fourth PMOS transistor 212, and the biasing circuit arranged to provide a respective bias voltage to the third and fourth PMOS transistors 210, 212 for biasing them to operate in Class-C mode. Preferably, the biasing circuit is a low pass RC circuit. As shown in FIG. 1, the RC circuit includes two capacitors 220, 222 and two resistors 224, 226 in electrical connection with each other. Preferably, the resistors 224, 226 are connected to a common node 228 biased at voltage $V_{bias}$. In one embodiment, one resistor 226 of the RC circuit is connected between the gate terminal of the third PMOS transistor 210 and the node 228, and another resistor 224 of the RC circuit is connected between the gate terminal of the fourth PMOS transistor 212 and the node 228. In one embodiment, one capacitor 220 of the RC circuit is connected between the drain terminal of the third PMOS transistor 210 and the gate terminal of the fourth PMOS transistor 212, and another capacitor 222 of the RC circuit is connected between the drain terminal of the fourth PMOS transistor 212 and the gate terminal of the third PMOS transistor 210. By providing a biasing circuit arrangement as described above, the third and fourth PMOS transistors 210, 212 can be cross-coupled with each other, i.e., with a gate terminal of one being connected with a drain terminal of the other. Preferably, the oscillator circuit 204 has a substantially symmetric circuit architecture.

In the present embodiment, the second voltage controlled oscillator 200 further includes the tuning circuit 206 connected between the third and fourth PMOS transistors 210, 212. As shown in FIG. 1, the tuning circuit 206 is connected across the drain terminals of the third and fourth PMOS transistors 210, 212. Preferably, the tuning circuit 206 is a capacitor array circuit, such as a 4-bit switchable capacitor array as illustrated. Referring to FIG. 1, the 4-bit switchable capacitor array 106 includes two n-channel MOSFETs (NMOS transistors) 14, 16, two capacitors 18, 20, and a number of resistors 22, 24, 26, 28 in electrical connection with each other. Specifically, the gate terminals of the two NMOS transistors 14, 16 are connected with each other, and with a resistor 22. The source terminals of the two NMOS transistors 14, 16 are connected with each other, and with a grounded resistor 24. The drain terminals of each NMOS transistors 14, 16 are connected with a grounded resistor 26, 28 as well as a capacitor 18, 20. Preferably, the two capacitors 18, 20 are electrically connected with the drain terminals of the third and fourth PMOS transistors 210, 212 respectively. Preferably, the capacitor array circuit 206 has a substantially symmetric circuit architecture. The capacitor array circuit 206 in the present embodiment provides a wide tuning range.

In one embodiment, the second voltage controlled oscillator 200 further includes the resonator tank 208 in the form of a LC resonator circuit. Preferably, the LC resonator circuit 208 includes two branches arranged in parallel between the drain terminals of the third and fourth PMOS transistors 210, 212. Preferably, the LC resonator 208 includes two resistors 230, 232, two diodes 234, 236, two capacitors 238, 240, and an inductor 242 in electrical connection with each other. As shown in FIG. 1, in the first branch, there are two diodes 234, 236 connected to the same node 244 biased at $V_{tune}$. The diodes 234, 236 are biased in a manner such that current can only flow into but not out of the node 244. The first branch further includes two capacitors 238, 240 each connected between a drain terminal of the respective third and fourth PMOS transistors 210, 212 and a respective diode 234, 236. A first sub-branch comprising two resistors 230, 232 is arranged in parallel with the two diodes 234, 236. The resistors 230, 232 in the sub-branch are connected at the same node 246 at voltage V. In the present example, the voltage V is 0.7 volt. In the present embodiment, the second branch includes an inductor 242 connected to ground, and in parallel with the first branch. Preferably, the LC resonator circuit 208 has a substantially symmetric circuit architecture.

In the present embodiment, the first and second voltage controlled oscillators 100, 200 are electrically connected with each other through different electrical connections. Firstly, as shown in FIG. 1, the current source 102 of the first voltage controlled oscillator 100 and the current source 202 of the second voltage controlled oscillator 200 are connected with the same node 12 biased at voltage $V_{dd}$. Secondly, the first and second voltage controlled oscillators 100, 200 incorporate a bulk-coupled architecture for connecting the first and second PMOS transistors 110, 112 and the third and fourth PMOS transistors 210, 212.

In the bulk-coupled architecture, the bulk terminals of the PMOS transistors 110, 112, 210, 212 are used to couple the first voltage controlled oscillator 100 with the second voltage controlled oscillator 200. Referring to FIG. 1, the bulk terminal of the first PMOS transistor 110 is connected with the drain terminal of the fourth PMOS transistor 212 through node I⁻, and the bulk terminal of the second PMOS transistor 112 is connected with the drain terminal of the third PMOS transistor 210 through node I⁺. Also, the bulk terminal of the third PMOS transistor 210 is connected with the drain terminal of the first PMOS transistor 110 through node Q⁺, and the bulk terminal of the fourth PMOS transistor 212 is connected with the drain terminal of the second PMOS transistor 112 through node Q⁻. In the present embodiment, a capacitor 148 is arranged between the bulk terminal of the first PMOS transistor 210 and the drain terminal of the fourth PMOS transistor 212; a capacitor 150 is arranged between the bulk terminal of the second PMOS transistor 112 and the drain terminal of the third PMOS transistor 210; a capacitor 248 is arranged between the bulk terminal of the third PMOS transistor 210 and the drain terminal of the first PMOS transistor 110; and a capacitor 250 is arranged between the bulk terminal of the fourth PMOS transistor 212 and the drain terminal of the second PMOS transistor 112. These capacitors 148, 150, 248, 250 are operable to perform DC block functions.

A person skilled in the art would understand that variations and modifications based on the preferred configuration of the quadrature voltage controlled oscillator 10 as shown in FIG. 1 are possible. For example, the same current source may be used to provide the current sources 102, 202 of the first voltage controlled oscillator 100 and the second voltage controlled oscillator 200. In other embodiments, NMOS transistors may be used in place of PMOS transistors 110, 112, 210, 212. The quadrature voltage controlled oscillator 10 may be fabricated in other processes other than CMOS.

Figure 2A:
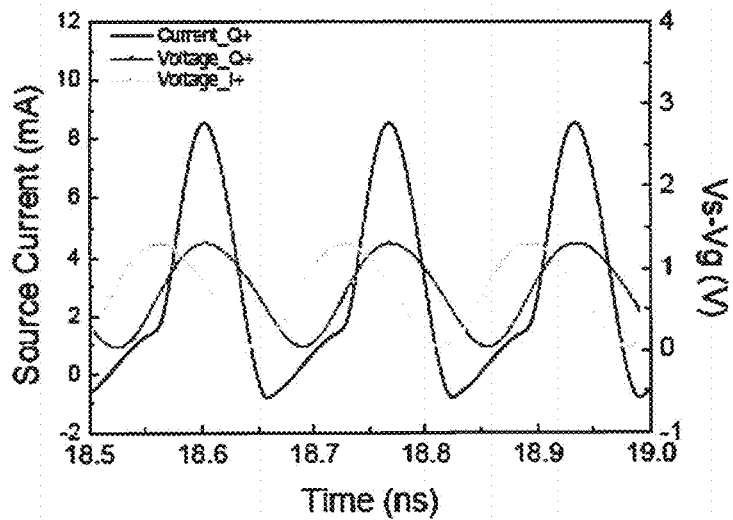
FIG. 2A is a graph showing the simulated time-domain source current and source-gate voltage waveforms of the PMOS transistor for the quadrature voltage controlled oscillator of FIG. 1.

FIG. 2A shows the simulated time-domain source current and source-gate voltage ($V_s$-$V_g$) waveforms of the PMOS transistor for the quadrature voltage controlled oscillator of FIG. 1. As shown in FIG. 2A, the voltage at Q⁺ and the voltage at I⁺ are in quadrature, i.e., 90° out of phase with each other. Also, under a biasing current of 1.2 mA, a large current pulse (source current) with an amplitude of around 10 mA is generated. With the same power consumption, the oscillator in the present embodiment provides higher oscillation efficiency, which is defined as the ratio of the output power $P_{RFout}$ to the DC power consumption $P_{DC}$:

$$\eta = \frac{P_{RFout}}{P_{DC}} = \frac{P_{RFout}}{V_{DC} \cdot I_{DC}} \quad (1)$$

Figure 2B:
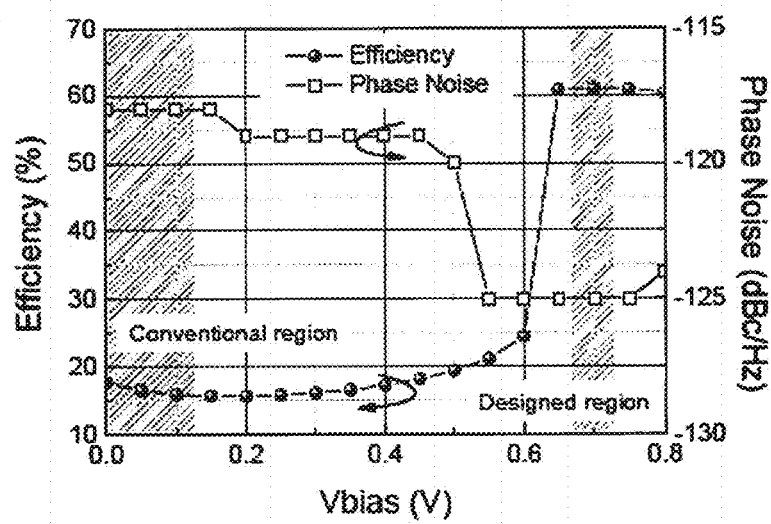
FIG. 2B is a graph showing the simulated oscillation efficiency and phase noise against the biasing voltage for the quadrature voltage controlled oscillator of FIG. 1.

FIG. 2B shows the simulated oscillation efficiency of the quadrature voltage controlled oscillator of FIG. 1 under different biasing voltages. The Class-AB and the Class-C operation regions are shaded in the Figure.

As shown in FIG. 2B, the oscillation efficiency improves as the biasing condition changes from Class-AB to Class-C. When the PMOS transistors enter Class-C condition (in the present embodiment, when $V_{bias}$=0.75 V), the narrow-waveform drain current grows rapidly, and this leads to a sharp increase of the oscillation efficiency. In FIG. 2B, the simulated maximum efficiency is around 60%, with 0.677 dBm RF power output, drawing 4.34 mA current from a 1.8 V voltage supply.

The phase noise of the quadrature voltage controlled oscillator in the present invention at an offset frequency of $\Delta f$ can be derived using $$L(\Delta f) = 10 \text{Log}\left(\frac{4k_B \cdot T + \gamma_P \cdot k_B \cdot T}{4\pi^2 \cdot \Delta f^2 \cdot C^2 \cdot R_T^3 \cdot I_{\omega 0}^2}\right) \quad (2)$$

where $k_B$ is the Boltzmann's constant, T is the absolute temperature, $Y_P$ is the proportionality constant, $R_T$ is the tank resistance, and C is the tank capacitance. Since a higher fundamental current amplitude $I_{\omega 0}$ has been generated in the oscillator of the present invention that employs Class-C operation, lower phase noise is achieved.

FIG. 2B further shows the variation of simulated phase noise along with the change of biasing voltages. As shown in FIG. 2B, a minimum phase noise of −125 dBc/Hz at 1 MHz offset is realized under Class-C operation. In other words, the Class-C operation in the present embodiment provides more than 5 dB phase noise improvement compared with other working states as shown in FIG. 2B. However, as the biasing voltage is further increased, the oscillation condition is disrupted, and this leads to the phase noise deterioration.

In the present invention, the quadrature generation is realized based on bulk-coupled architecture. Specifically, in the present embodiment, the frequency offset is expressed as $$\Delta f = f_{osc} - f_0 = \frac{f_0}{2 \cdot Q_{\lambda sik}} \cdot \tan^{-1}\left(\frac{I_C}{I_M}\right) \quad (3)$$

where $f_{osc}$ and $f_0$ denote the oscillation frequency of quadrature voltage controlled oscillator and differential voltage controlled oscillator, $I_C$ and $I_M$ represent the drain currents of the coupling transistors and the main transistors, respectively. As the bulk-coupled structure of the quadrature voltage controlled oscillator 10 introduces a negligible $I_C$ current compared with conventional P-QVCO and S-QVCO topologies, the output frequency modulation in the present invention can be alleviated. As a result, a low phase noise of quadrature signal generation is further assured.

To verify the performance of the quadrature voltage controlled oscillator 10 in the present embodiment of the invention, a quadrature voltage controlled oscillator was designed and fabricated based on the oscillator circuit illustrated in FIG. 1. In the present example, the quadrature voltage controlled oscillator is designed and fabricated in TSMC 0.18 μm CMOS technology. Measurements were performed on the fabricated quadrature voltage controlled oscillator.

Figure 3A:
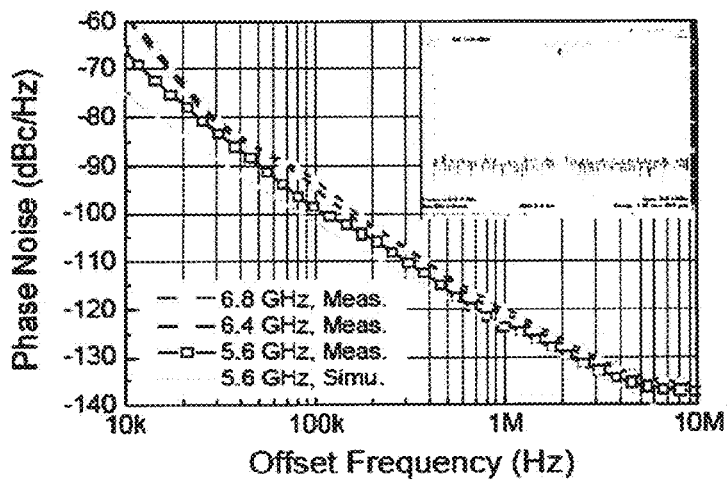
FIG. 3A is a graph showing phase noise at different offset frequencies for a quadrature voltage controlled oscillator fabricated based on the circuit diagram of FIG. 1.
Figure 3B:
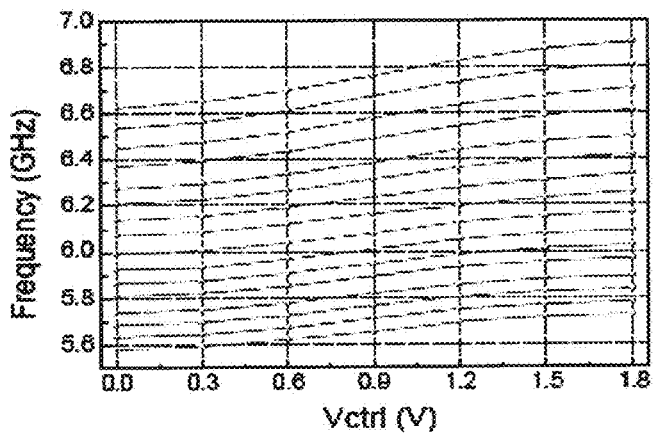
FIG. 3B is a graph showing the frequency tuning curves for the quadrature voltage controlled oscillator fabricated based on the circuit diagram of FIG. 1.

FIGS. 3A and 3B show the measured phase noise and tuning curves of the fabricated quadrature voltage controlled oscillator. In FIG. 3A, 1 MHz offset phase noises at the frequency of 5.6 GHz, 6.4 GHz and 6.8 GHz are −124 dBc/Hz, −122.3 dBc/Hz and −120.2 dBc/Hz respectively. In the frequency tuning curves of FIG. 3B, the output power is −0.8 dBm, and the tuning range is 22.6%, covering from 5.58 GHz to 6.94 GHz.

Figure 3C:
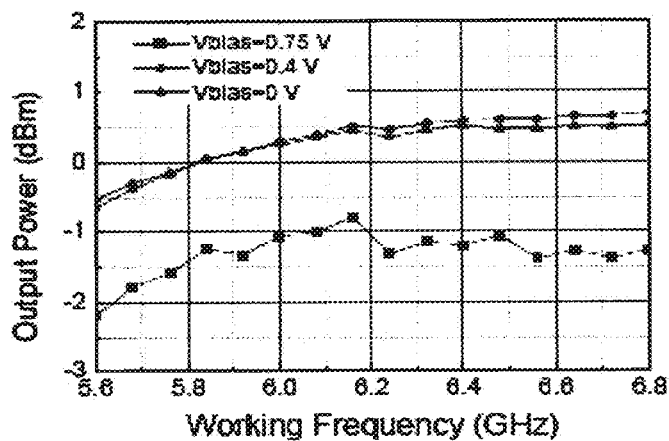
FIG. 3C is a graph showing the measured output power at different working frequencies for different bias voltages for the quadrature voltage controlled oscillator fabricated based on the circuit diagram of FIG. 1.

FIG. 3C shows the measured output power at different working frequencies for different bias voltages of the fabricated quadrature voltage controlled oscillator. As shown in FIG. 3C, the achieved maximum output power is −0.8 dBm as the voltage controlled oscillator enters into Class-C condition. In FIG. 3C, the output power varies across the working frequency, and this may be caused by the switching of 4-bit capacitor array.

In order to simultaneously quantify the amplitude and phase error (α, ϕ) of the designed quadrature voltage controlled oscillator, an up-conversion image reject mixer is built and utilized. The image rejection ratio (IRR) of the mixer indicates the amplitude and phase error of the quadrature voltage controlled oscillator, with it is expressed as $$IRR = \frac{(1-\alpha)^2 + |2(1+\alpha) \cdot \cos\varphi + 1}{(1+\alpha)^2 - 2(1+\alpha) \cdot \cos\varphi + 1} \quad (4)$$

Figure 4A:
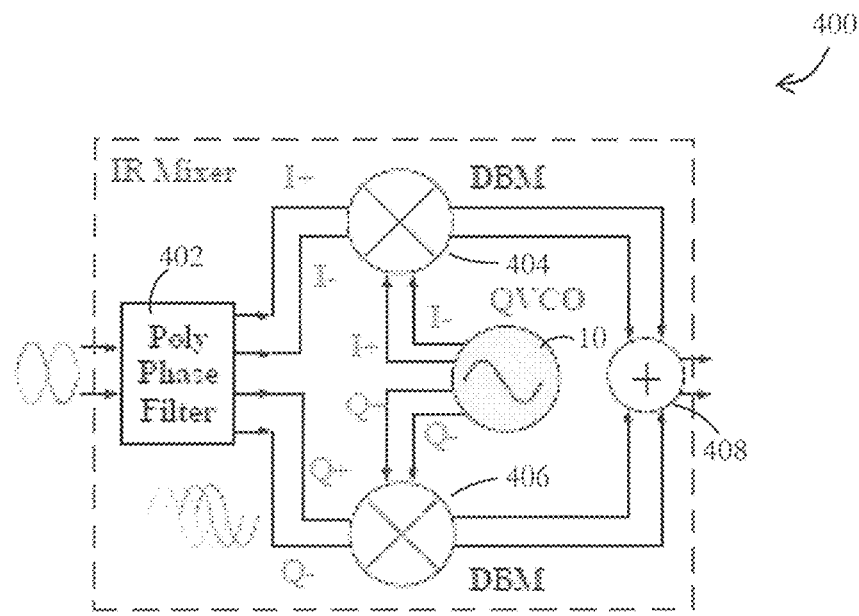
FIG. 4A is a circuit diagram showing an image reject mixer having a quadrature voltage controlled oscillator of FIG. 1 in accordance with one embodiment of the present invention.

FIG. 4A shows a circuit of the image reject mixer 400 in accordance with one embodiment of the present invention. In the present embodiment, the image reject mixer 400 includes an input filter module 402 arranged to receive an input signal, two mixers 404, 406 connected with the input filter module 402, a quadrature voltage controlled oscillator 10 connected with the two mixers 404, 406, and an output combiner 408 connected with the two mixers. Preferably, the input filter module 402 is preferably a poly phase filter. The poly phase filter module includes two input channels for receiving an input signal, and four output channels for outputting the processed input signal to the mixers 404, 406. Two of the output channels I$^+$, I$^-$ are connected to a first mixer 404, whilst two of the other output channels Q$^+$, Q$^-$ are connected to the second mixer 406. Preferably, the quadrature voltage controlled oscillator 10 is the same as the one illustrated in FIG. 1. More particular, the bulk terminals of the first and second PMOS transistors in the quadrature voltage controlled oscillator 10 are connected with the first mixer 404, and the bulk terminals of the third and fourth PMOS transistors in the quadrature voltage controlled oscillator 10 are connected with the second mixer 406. The quadrature voltage controlled oscillator 10 is arranged to provide a signal to be mixed with the signal outputted from the filter module to the mixers 404, 406. The signals processed by the mixers 404, 406 can then be transmitted to the combiner 408. The combiner 408 in the present embodiment is arranged to combine these signals and provide a processed output signal through two output channels.

Figure 4B:
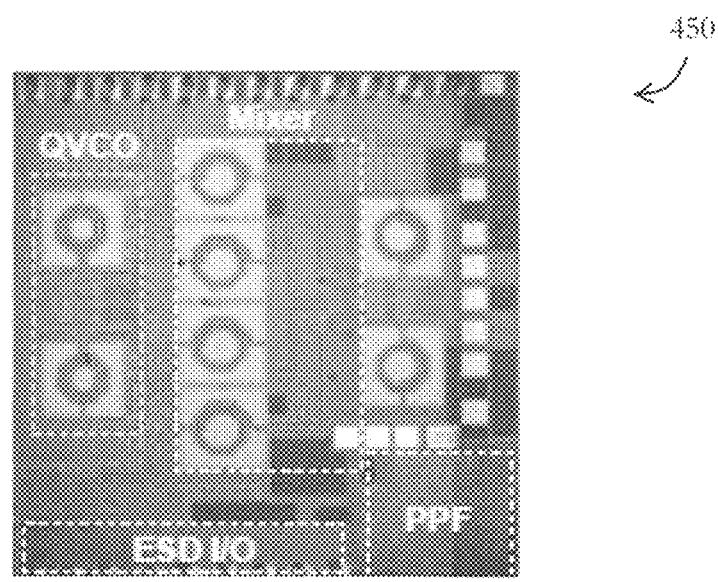
FIG. 4B is a chip micrograph showing an image reject mixer fabricated based on the circuit diagram of FIG. 4A in accordance with one embodiment of the present invention.

FIG. 4B shows a chip micrograph 450 of the fabricated image reject mixer including a poly phase filter (PFF) and a quadrature voltage controlled oscillator (QVCO) that has the same structure as shown in FIG. 1. In this example, the core area of quadrature voltage controlled oscillator is 840 μm×300 μm.

Figure 4C:
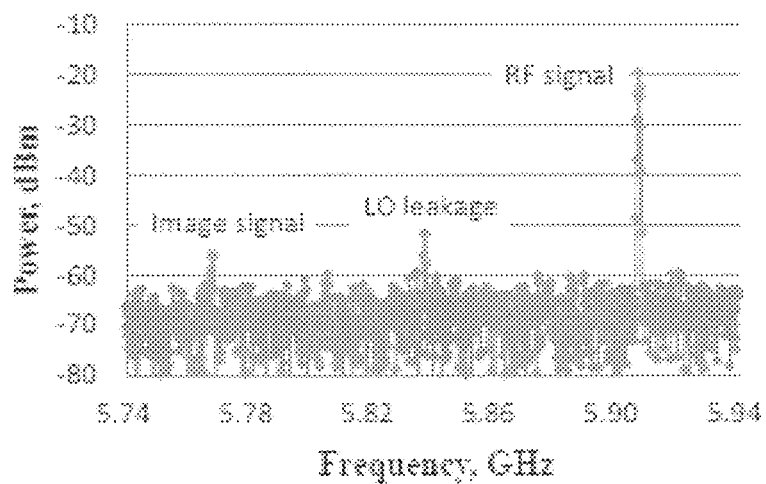
FIG. 4C is a graph showing the output power spectrum of the image reject mixer of FIG. 4B.
Figure 4D:
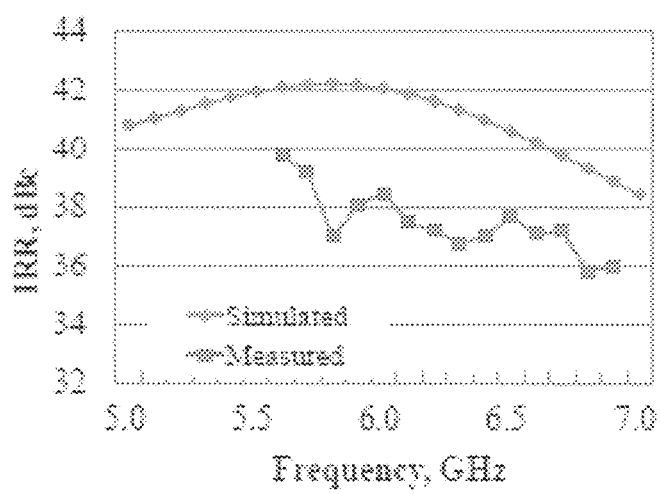
FIG. 4D is a graph showing the image rejection ratio bandwidth performance of the image reject mixer of FIG. 4B.

FIGS. 4C and 4D show the measured output power spectrum and the image rejection ratio bandwidth performance of the fabricated mixer, with an input intermediate frequency signal at 70 MHz. As shown in FIG. 4C, a local oscillator (LO) suppression of 50 dB is obtained. On the other hand, as shown in FIG. 4D, the peak value of the measured image rejection ratio is 40 dBc. These results demonstrated that the amplitude and phase errors are within 1% (0.086 dB) and 1°.

For evaluation purpose, the figure of merit (FOM) and FOM$_T$ are also employed $$FOM = L(\Delta f) - 20\log_{10}\left(\frac{f_{OC}}{\Delta f}\right) + 10\log_{10}\left(\frac{P_{OC}}{mW}\right) \quad (6)$$

$$FOM_T = L(\Delta f) - 20\log_{10}\left(\frac{f_{OC}}{\Delta f} \cdot \frac{\text{Tuning Range}}{10\%}\right) + 10\log_{10}\left(\frac{P_{OC}}{mW}\right) \quad (6)$$

In the present embodiment, the measured FOM and FOM$_T$ at 6.4 GHz for the designed quadrature voltage controlled oscillator are −189 and −201 at 1 MHz offset, respectively. Table I shows the performance parameters of the quadrature voltage controlled oscillated in the present embodiment.

TABLE I

| Parameters | Frequency | Tuning Range | Phase Noise | Power | FOM | FOM$_T$ |
|---|---|---|---|---|---|---|
| Values | 6.4 GHz | 22.6% | −122.3 dBc/Hz | 8.64 | −189 | −201 |

The embodiments of the present invention provide a quadrature voltage controlled oscillator that utilizes a PMOS-transistors-only oscillator circuit with a bulk-coupled architecture, and with the transistors and oscillators biased to operate in Class-C mode. In other words, quadrature signal generation in the present invention is realized by the integration of bulk-coupled technique and Class-C operation. Since additional coupling transistors are not used for coupling the two voltage controlled oscillators, no additional noise source is introduced and so phase noise can be improved significantly. In the embodiments of the present invention, the first and second voltage controlled oscillators use PMOS-transistors-only pair as the core transistor. This reduces the thermal and flicker noises, and results in a further improvement of phase noise. By employing Class-C operation, the quadrature voltage controlled oscillator in the present invention can generate high fundamental current using the same power, and this results in a higher oscillation efficiency.

The embodiments of the present invention provides a wideband, low phase noise, wide tuning range, high efficiency quadrature voltage controlled oscillator. The quadrature voltage controlled oscillator in the embodiments of the present invention is very suitable for low phase noise, wideband and precise quadrature signal generation.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A quadrature voltage controlled oscillator, comprising:
a first voltage controlled oscillator having a first current source, a first oscillator circuit, a first tuning circuit, and a first resonator tank electrically connected with each other;
a second voltage controlled oscillator having a second current source, a second oscillator circuit, a second tuning circuit, and a second resonator tank electrically connected with each other;
the first oscillator circuit comprises a first transistor, a second transistor and a first biasing circuit connected between the first and second transistors for biasing the first and second transistors to operate in Class-C mode;
the second oscillator circuit comprises a third transistor, a fourth transistor and a second biasing circuit connected between the third and fourth transistors for biasing the third and fourth transistors to operate in Class-C mode;
wherein bulk terminals of the first and second transistors are coupled with drain terminals of the third and fourth transistors respectively, and bulk terminals of the third and fourth transistors are coupled with drain terminals of the first and second transistors respectively, such that the first voltage controlled oscillator is electrically coupled with the second voltage controlled oscillator.

2. The quadrature voltage controlled oscillator in accordance with claim 1, wherein the first, second, third and fourth transistors are PMOS transistors.

3. The quadrature voltage controlled oscillator in accordance with claim 1, wherein the first biasing circuit comprises a low pass RC circuit arranged to provide a bias voltage to the first and second transistors to bias the first and second transistors to operate in Class-C mode.

4. The quadrature voltage controlled oscillator in accordance with claim 1, wherein the second biasing circuit comprises a low pass RC circuit arranged to provide a bias voltage to the third and fourth transistors to bias the third and fourth transistors to operate in Class-C mode.

5. The quadrature voltage controlled oscillator in accordance with claim 1, wherein source terminals of the first and second transistors are connected with each other; and source terminals of the third and fourth transistors are connected with each other.

6. The quadrature voltage controlled oscillator in accordance with claim 1, wherein a gate terminal of the first transistor is connected with a drain terminal of the second transistor through the first biasing circuit, and a gate terminal of the second transistor is connected with a drain terminal of the first transistor through the first biasing circuit.

7. The quadrature voltage controlled oscillator in accordance with claim 1, wherein a gate terminal of the third transistor is connected with a drain terminal of the fourth transistor through the second biasing circuit, and a gate terminal of the fourth transistor is connected with a drain terminal of the third transistor through the second biasing circuit.

8. The quadrature voltage controlled oscillator in accordance with claim 1, wherein the bulk terminal of the first transistor is connected with a drain terminal of the fourth transistor, the bulk terminal of the second transistor is connected with a drain terminal of the third transistor, the bulk terminal of the third transistor is connected with a drain terminal of the first transistor, and the bulk terminal of the fourth transistor is connected with a drain terminal of the second transistor.

9. The quadrature voltage controlled oscillator in accordance with claim 1, wherein the first current source is connected between a node and the source terminals of the first and second transistors for supplying current to the first and second transistors.

10. The quadrature voltage controlled oscillator in accordance with claim 9, further comprising a first capacitor connected in parallel with the first current source between the node and the source terminals of the first and second transistors.

11. The quadrature voltage controlled oscillator in accordance with claim 1, wherein the second current source is connected between a node and the source terminals of the third and fourth transistors for supplying current to the third and fourth transistors.

12. The quadrature voltage controlled oscillator in accordance with claim 11, further comprising a second capacitor connected in parallel with the second current source between the node and the source terminals of the third and fourth transistors.

13. The quadrature voltage controlled oscillator in accordance with claim 1, wherein the first and second current sources are the same current source.

14. The quadrature voltage controlled oscillator in accordance with claim 1, wherein the first tuning circuit comprises a capacitor array.

15. The quadrature voltage controlled oscillator in accordance with claim 14, wherein the first tuning circuit is a 4-bit switchable capacitor array.

16. The quadrature voltage controlled oscillator in accordance with claim 1, wherein the second tuning circuit comprises a capacitor array.

17. The quadrature voltage controlled oscillator in accordance with claim 16, wherein the second tuning circuit is a 4-bit switchable capacitor array.

18. The quadrature voltage controlled oscillator in accordance with claim 1, wherein the first resonator tank comprises an LC resonator circuit.

19. The quadrature voltage controlled oscillator in accordance with claim 1, wherein the second resonator tank comprises an LC resonator circuit.

20. The quadrature voltage controlled oscillator in accordance with claim 1, wherein the first tuning circuit and the first resonator tank are connected across the drain terminals of the first and second transistors.

21. The quadrature voltage controlled oscillator in accordance with claim 1, wherein the second tuning circuit and the second resonator tank are connected across the drain terminals of the third and fourth transistors.

22. The quadrature voltage controlled oscillator in accordance with claim 1, wherein the first voltage controlled oscillator is substantially identical to the second voltage controlled oscillator.

23. The quadrature voltage controlled oscillator in accordance with claim 1, wherein the quadrature voltage controlled oscillator is a CMOS quadrature voltage controlled oscillator.

24. A radiofrequency transceiver comprising the quadrature voltage controlled oscillator in accordance with claim 1.

\* \* \* \* \*